United States Patent
Goto

(10) Patent No.: US 8,011,936 B2
(45) Date of Patent: Sep. 6, 2011

(54) ELECTRICAL CENTER WITH A RELAY MODULE

(75) Inventor: Frank Goto, San Bernardo Do Campo (BR)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/866,283

(22) PCT Filed: Mar. 4, 2008

(86) PCT No.: PCT/US2008/002855
§ 371 (c)(1),
(2), (4) Date: Aug. 5, 2010

(87) PCT Pub. No.: WO2009/110860
PCT Pub. Date: Sep. 11, 2009

(65) Prior Publication Data
US 2010/0323539 A1    Dec. 23, 2010

(51) Int. Cl.
*H01R 12/00* (2006.01)
(52) U.S. Cl. ........................... 439/76.1; 439/341
(58) Field of Classification Search ............. 439/76.1, 439/620.22, 341, 376
See application file for complete search history.

(56) References Cited

U.S. PATENT DOCUMENTS

| | | | |
|---|---|---|---|
| 5,446,626 A | 8/1995 | Dittmann et al. | |
| 5,715,135 A * | 2/1998 | Brussalis et al. | 361/624 |
| 5,755,579 A * | 5/1998 | Yanase et al. | 439/76.2 |
| 5,936,842 A * | 8/1999 | Kaiser et al. | 361/752 |
| 6,184,762 B1 | 2/2001 | Reiss et al. | |
| 6,612,859 B2 | 9/2003 | Yeomans et al. | |
| 6,793,516 B1 | 9/2004 | Mamas | |
| 6,923,660 B2 * | 8/2005 | Takeuchi | 439/76.2 |
| 7,094,081 B1 * | 8/2006 | Senk et al. | 439/157 |
| 7,616,438 B2 * | 11/2009 | Shimizu et al. | 361/694 |
| 7,775,807 B2 * | 8/2010 | Yamaguchi et al. | 439/76.2 |
| 2002/0157847 A1 | 10/2002 | Chiriku et al. | |
| 2004/0065463 A1 | 4/2004 | Ishiguro et al. | |
| 2005/0159024 A1 | 7/2005 | Yamada et al. | |
| 2006/0141824 A1 | 6/2006 | Kubota et al. | |

* cited by examiner

*Primary Examiner* — T C Patel
*Assistant Examiner* — Harshad C Patel
(74) *Attorney, Agent, or Firm* — Thomas N. Twomey

(57) ABSTRACT

An electrical center includes a housing and a relay module that is disposed in a well of the housing. The relay module has a base, a printed circuit board assembly, plug in electronic components, a cover and means of coupling and latching of the base to the well in the housing. The base includes a tray having a depending shroud at one end portion. The end portion of the tray that has depending shroud has a plurality of apertures that extend through tie end portion of the tray. A plurality of terminals have first end portions that engage the printed circuit board for electrical connection to the plurality of relays and second end portions that plug into the apertures and terminate in free ends disposed in the space inside the shroud.

10 Claims, 3 Drawing Sheets

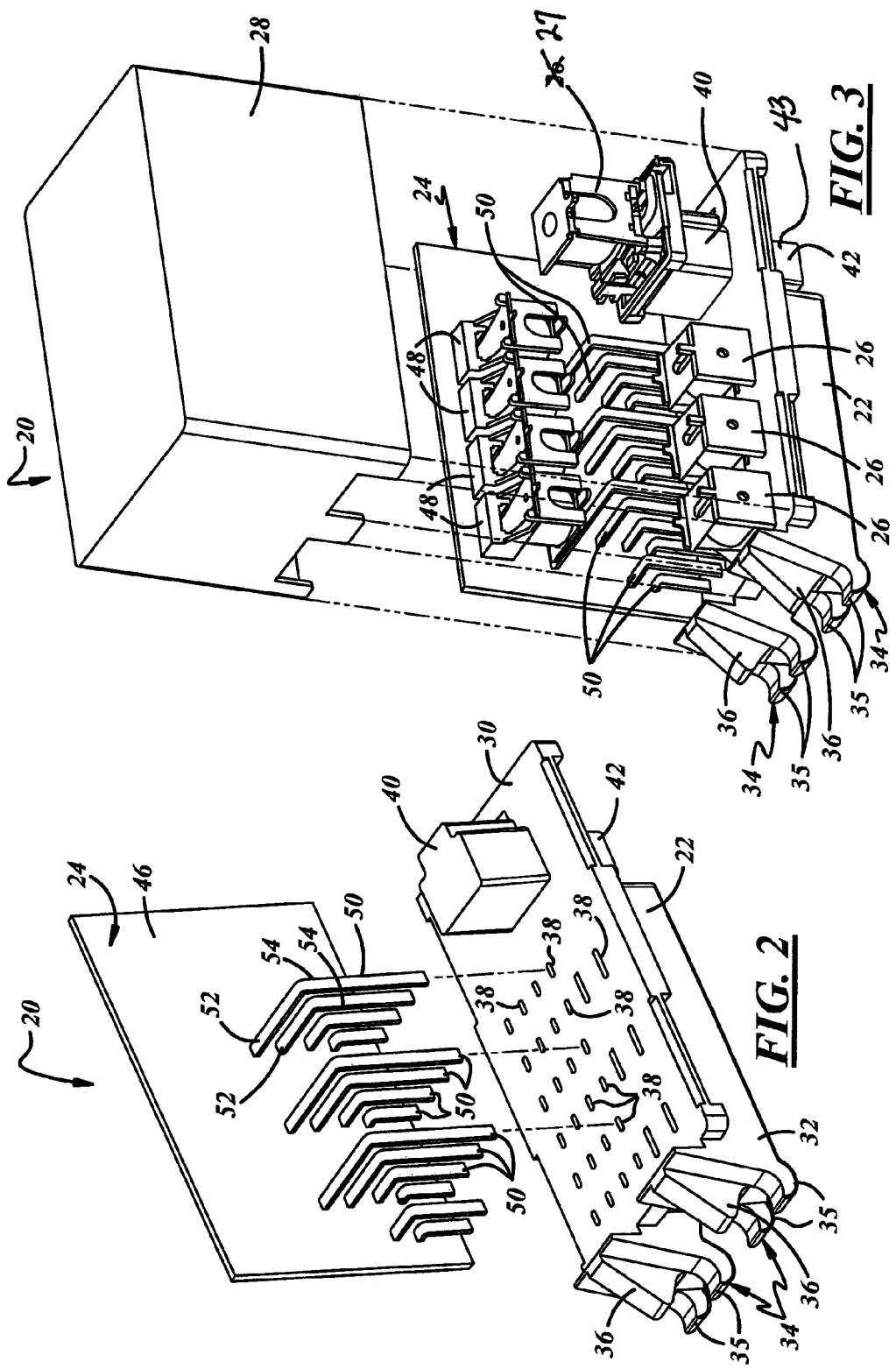

ELECTRICAL CENTER WITH A RELAY MODULE

BACKGROUND OF THE INVENTION

This invention relates to a relay module, an electrical center having a relay module and a method of assembling.

U.S. Pat. No. 5,717,135 granted to Stacy Ann Brussalis et al. Feb. 3, 1998 discloses an electrical distribution center of a type that is widely used in automobiles. These electrical distribution centers typically have a large number of electrical and electronic devices such as fuses and relays that are plugged into the electrical distribution center. An automobile normally uses from ten to twenty relays and many of these relays are plug-in type relays. For instance an automobile may have a main relay, a low beam relay, a high beam relay, a first blower speed relay, a turn signal blinker relay, a windshield wiper relay, a fuel pump relay and a cold start relay, for the basic functions of the automobile. These eight or so basic function relays are plugged into the electrical distribution center individually along with several other components, such as fuses and more specialized relays that are also plugged into the electrical distribution center individually. Alternatively all of these components can be plugged into a housing to form a sub-assembly that is then plugged into the electrical distribution center. However, this alternative usually requires mechanical assistance to plug the sub-assembly into the electrical distribution center. See for instance, U.S. Pat. No. 7,094,081 granted to Joseph M. Senk et al. Aug. 22, 2006.

SUMMARY OF THE INVENTION

In one aspect, the invention provides a relay module for an electrical center having an area adapted to receive the relay module. The relay module comprises a lower base, a printed circuit board assembly and a cover. The lower base includes a tray having a depending shroud at one end portion and a pair of laterally spaced couplers at one end of the tray. The end portion of the tray has a plurality of slots that extend through the end portion of the tray to communicate with a space inside the depending shroud. The printed circuit board assembly has a printed circuit board that is attached to the top of the tray near a side edge, a plurality of relays that are attached to an upper portion of the printed circuit board. The relays are electrically connected to a plurality of terminals that are disposed beneath the relays. The plurality of terminals have first end portions that engage the printed circuit board for electrical connection to the plurality of relays and second end portions that plug into the apertures and terminate in free ends disposed in the space inside the shroud. The cover including latch means at an end of the relay module that is opposite an end of the relay module that has the couplers.

In another aspect the invention provides an electrical center comprising a housing that has an area adapted for receiving a relay module in combination with a relay module that is plugged into the area of the housing. The module has a lower base, a printed circuit board assembly and a cover. The lower base includes a tray having a depending shroud at one end portion and a pair of laterally spaced couplers at one end of the tray that engage a lock bar of the housing. An end portion of the tray has a plurality of apertures that extend through the end portion of the tray to communicate with a space inside the depending shroud. The printed circuit board assembly includes a printed circuit board 46 that is attached to the top of the tray near a side edge and a plurality of relays that are attached to an upper portion of the printed circuit board. The relays are electrically connected to a plurality of terminals that are disposed beneath the relays. The plurality of terminals have first end portions that engage the printed circuit board for electrical connection to the plurality of relays and second end portions that plug into the apertures and terminate in free ends disposed in the space inside the shroud. The cover includes latch means at an end that is opposite the end that has the couplers that engages cooperating lock means of the housing to retain the relay module in assembly with the housing.

In still another aspect the invention provides a method of attaching a relay module having a coupler at a forward end and latch means at a rearward end to a housing having a well. The forward end of the relay module is inserted into the well of the housing with the relay module 20 oriented at an angle until the coupler of the relay module engages an internal lock bar in the well of the housing. The relay module is then rotated on the lock bar until the rear wind of the relay module is disposed in the well and the latch means engages a cooperating lock means of the housing to retain the relay module in assembly with the housing.

BRIEF DESCRIPTION OF THE DRAWINGS

FIG. 2 is an exploded perspective view of a relay module shown in FIG. 1;

FIG. 3 is another exploded perspective view of the relay module shown in FIG. 1;

DETAILED DESCRIPTION OF THE PREFERRED EMBODIMENTS

Figure 1:
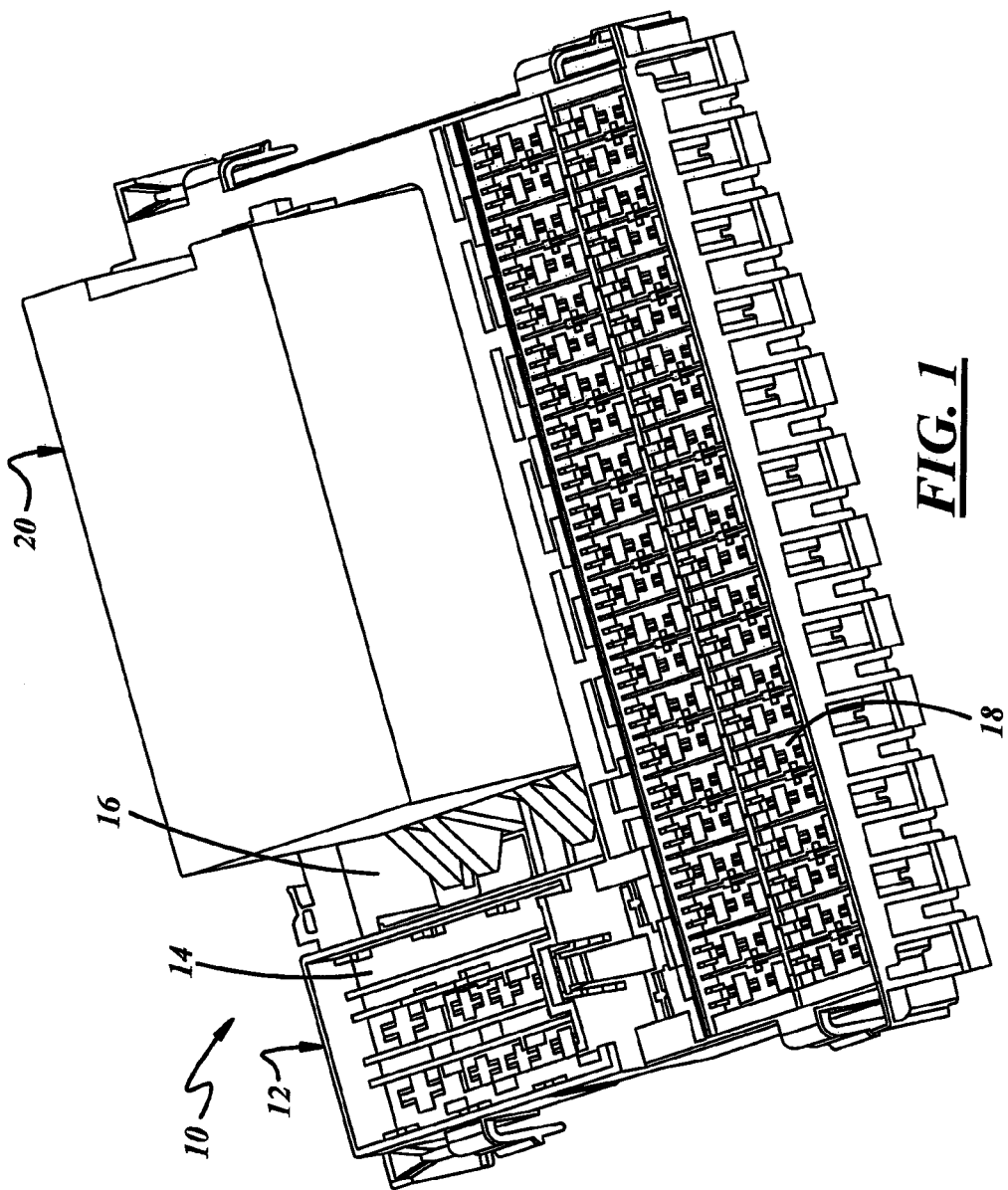
FIG. 1 is a perspective view of an electrical center illustrating an embodiment of the invention.

Referring now to the drawings, an electrical center illustrating an embodiment of the invention is indicated generally at 10. Electrical center 10 comprises a housing 12 that has differently configured areas 14, 16 and 18 for receiving various electrical components such as fuses, relays, etc. After being loaded with these various electrical components, housing 12 is then typically assembled into an automobile and connected into the electrical system of the automobile.

Figure 4:
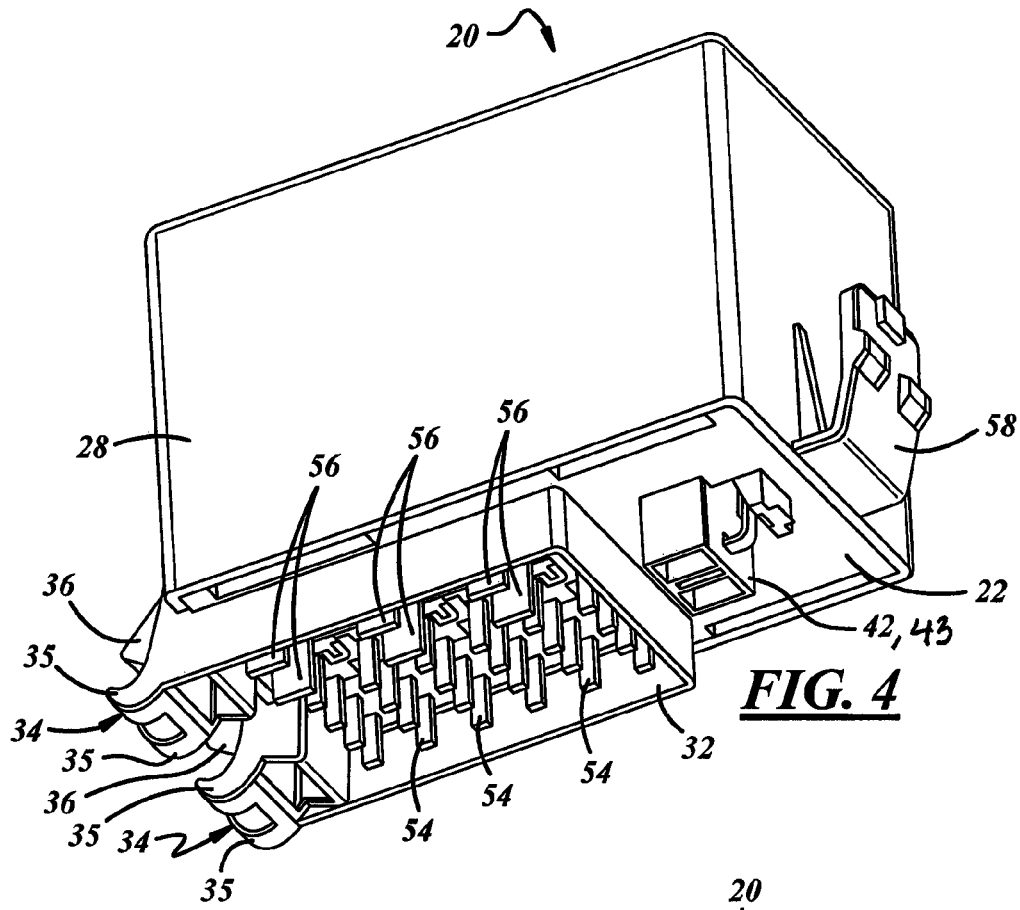
FIG. 4 is a perspective view of the relay module shown in FIG. 1.

Electrical center 10 includes a relay module 20 that is plugged into area 16 that is specifically designed to receive the relay module. Relay module 20 comprises a lower base 22, a printed circuit board assembly 24, several plug in electronic components 26 and a cover 28 as best shown in FIGS. 2, 3 and 4.

Lower base 22 which is preferably of one piece molded plastic construction comprises a tray 30 having a depending shroud 32 at one end portion. A pair of laterally spaced couplers 34 are integrally attached to a contiguous end wall of the tray 30 and depending shroud 32. Each coupler 34 comprises a pair of lower hooks 35 on either side of an upper triangular shaped guide 36. The end portion of the tray 30 above the depending shroud 32 has a plurality of apertures 38 that extend through the end portion of the tray 30 for receiving terminal blades that extend through the apertures 38 and down into the space inside the shroud 32. The opposite end portion of the tray 30 includes a pedestal 40 that forms an upper part of connector body 42 that projects through the tray 30 and that includes a lower socket 43 below the tray 30.

Connector body 42 may be an integral part of the lower base 22 or a separate part that is attached to the lower base 22.

The printed circuit board assembly 24 comprises a printed circuit board 46 that is attached to the top of the tray 30 near a side edge. A plurality of relays 48 are attached to the upper portion of the printed circuit board 46. Relays 48 may be plug-in or surface mounted relays. In any event, these relays 48 are connected electrically to a plurality of L-shaped electrically conductive blades 50 that are disposed beneath the relays 48. The L-shaped blade terminals 50, which are preferably stamped and bent metal, have horizontal leg 52 that plug into vias in the printed circuit board for electrical connection to the relays 48 by way of conductor strips forming part of the printed circuit board. Printed circuit boards as well as the attachment of relays and terminals to the circuit board are well known and consequently these details are not and need not be shown in detail. The L-shaped blade terminals 50 also have vertical legs 54 that plug into the slots 38 and terminate in free ends disposed in the space inside shroud 38 as best shown in FIG. 4.

Relay module 20 may also include additional plug in electronic components 26. Several electronic components 26 may be plugged into the end portion of tray 30 so that their metal terminal tabs 56 extend through slots 38 and into the space inside shroud 32 and an additional electronic component 27 may be plugged into pedestal 40. Electronic components 26 may be relays and the electronic component 27 that is plugged into pedestal 50 may be a main relay for electrical connection to a wiring harness (not shown) that plugs into the lower socket 43 of connector body 42.

After the printed circuit board assembly 24 and the electronic components 26 are attached to the tray 30, cover 28 is attached to the tray 30 in a suitable manner as shown in FIG. 4 to complete the relay module 20. Cover 28 of the relay module 20 includes a flexible latch arm 58 at the end of the module 20 that is opposite the end that has the couplers 34.

Figure 5:
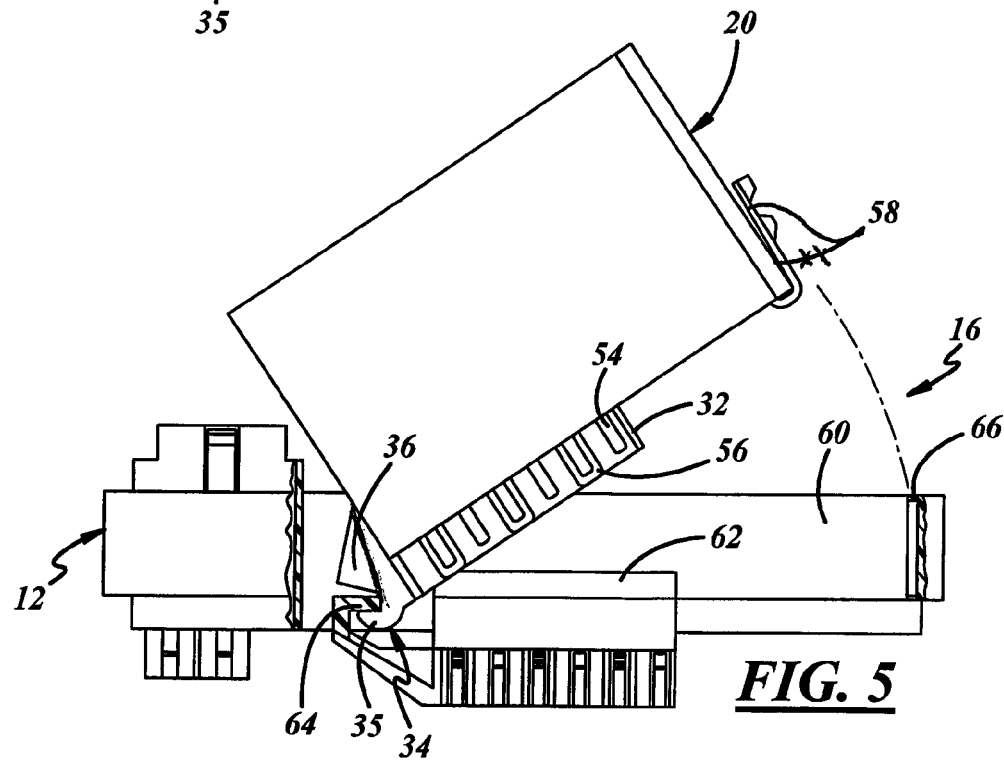
FIG. 5 is a partially sectional view of the relay module in the process of being assembled into the electrical center shown in FIG. 1.

The relay module 20 is attached to area 16 of the housing 12 which includes a well 60 for receiving the relay module 20. Projecting into the well 60 of area 16 are internal side flanges 62 for supporting relay module, an internal lock bar 64 at one end of the well and an internal lock nib 66 at the opposite end of the well. The relay module 20 is attached to the housing 12 by inserting the relay module 20, coupling end first, into the well 60 at an angle until the internal lock bar 64 is engaged by the couplers 34 between the hooks 35 and the guides 36 as shown in FIG. 5. The relay module 20 is then rotated (clockwise as shown in FIG. 5) into the well 60 fully engaging the internal side flanges 62 for support and with the flexible lock arm 58 engaging lock nib 66. The relay module 20 is firmly retained in well 60 by lower hooks 35 at one end and the flexible lock arm 58 at the other end.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

I claim:

1. A relay module for an electrical center having an area adapted to receive the relay module, the relay module comprising:

a lower base, a printed circuit board assembly, and a cover the lower base comprising a tray having a depending shroud at one end portion and a pair of laterally spaced couplers at one end of the tray, an end portion of the tray having a plurality of apertures that extend through the end portion of the tray to communicate with a space inside the depending shroud, the printed circuit board assembly having a printed circuit board that is attached to the top of the tray near a side edge, a plurality of relays that are attached to an upper portion of the printed circuit board, the relays being electrically connected to a plurality of terminals that are disposed beneath the relays, the plurality of terminals having first end portions that engage the printed circuit board for electrical connection to the plurality of relays, the plurality of terminals having second end portions that plug into the apertures and terminate in free ends disposed in the space inside the shroud, and the cover including latch means at an end of the relay module that is opposite an end of the relay module that has the couplers.

2. The relay module as defined in claim 1 wherein the pair of laterally spaced couplers are integrally attached to a contiguous end wall of the tray and the depending shroud, and wherein each coupler has a pair of lower hooks on either side of an upper triangular shaped guide and the latch means comprises a flexible latch arm.

3. The relay module as defined in claim 1 wherein the plurality of terminals are L-shaped, wherein the first end portions are generally horizontal, and wherein the second end portions are generally vertical.

4. The relay module as defined in claim 1 wherein the relay module includes additional plug in electronic components that are plugged into the end portion of tray, the plug-in electronic components having metal terminal tabs that extend through the apertures and into the space inside the shroud.

5. The relay module as defined in claim 1 wherein the relay module includes a main relay that is mounted on an upper pedestal of a connector body that extends through the tray to a lower socket adapted for electrical connection to a wiring harness.

6. An electrical center comprising:

a housing that has an area adapted for receiving a relay module in combination with a relay module that is plugged into the area of the housing;

the module having a lower base, a printed circuit board assembly, and a cover, the lower base comprising a tray having a depending shroud at one end portion and a pair of laterally spaced couplers at one end of the tray that engage a lock bar of the housing, an end portion of the tray having a plurality of apertures that extend through the end portion of the tray to communicate with a space inside the depending shroud, the printed circuit board assembly having a printed circuit board that is attached to the top of the tray near a side edge, a plurality of relays that are attached to an upper portion of the printed circuit board, the relays being electrically connected to a plurality of terminals that are disposed beneath the relays, the plurality of terminals having first end portions that engage the printed circuit board for electrical connection to the plurality of relays, the plurality of terminals having second end portions vertical legs that plug into the apertures and terminate in free ends disposed in the space inside the shroud, and a cover that includes latch means at an end that is opposite the end that has the couplers, the latch means engaging cooperating lock means of the housing to retain the relay module in assembly with the housing.

7. The electrical center as defined in claim 6 wherein the area of the housing that is adapted for receiving the relay module is a well that has internal side flanges that project into the well and support the relay module, wherein the pair of laterally spaced couplers are integrally attached to a contiguous end wall of the tray and the depending shroud, wherein each coupler has a pair of lower hooks on either side of an upper triangular shaped guide that engage the internal lock bar of the housing, wherein the latch means of the relay module comprises a flexible latch, and wherein the lock means of the housing comprises an internal lock nib that is engaged by the flexible latch arm.

8. The electrical center as defined in claim 6 wherein the plurality of terminals are L-shaped, wherein the first end portions are generally horizontal, and wherein the second end portions are generally vertical.

9. The electrical center as defined in claim 6 wherein the relay module includes additional plug in electronic components that are plugged into the end portion of tray, the plug in electronic components having metal terminal tabs that extend through the apertures and into space inside the shroud.

10. The electrical center as defined in claim 6 wherein the relay module also includes a main relay that is mounted on the upper pedestal of a connector body that extends through the tray to a lower socket adapted for electrical connection to a wiring harness.

* * * * *